United States Patent [19]

Yamamoto et al.

[11] Patent Number: 5,174,858
[45] Date of Patent: Dec. 29, 1992

[54] METHOD OF FORMING CONTACT STRUCTURE

[75] Inventors: Hiroshi Yamamoto, Chiba; Kazuyuki Sawada, Hirakata, both of Japan

[73] Assignee: Matsushita Electric Industrial Co., Ltd., Osaka, Japan

[21] Appl. No.: 710,087

[22] Filed: Jun. 4, 1991

[30] Foreign Application Priority Data

Jun. 4, 1990 [JP] Japan ................... 2-146541

[51] Int. Cl.[5] ................ H01L 21/306; B44C 1/22; C23F 1/00; C03C 15/00
[52] U.S. Cl. .................. 156/643; 156/644; 156/651; 156/653; 156/656; 156/657; 156/659.1; 156/662; 257/301; 257/758; 437/52; 437/189; 437/203; 437/245
[58] Field of Search ............. 156/643, 644, 651, 652, 156/653, 656, 657, 659.1, 661.1, 662; 437/48, 49, 52, 189, 190, 192, 193, 195, 200, 203, 228, 238, 245; 357/65, 71

[56] References Cited

U.S. PATENT DOCUMENTS 5,059,548 10/1991 Kim .................... 437/52

OTHER PUBLICATIONS

T. Kaga et al., *Extended Abstracts of 19th SSDM*, pp. 15-18, 1987.
Fuse et al., *The Proceeding of the 19th Solid Element and Material Conference*, p. 11 (Tokyo, Aug. 1987).
Kusters et al., *Symp. VLSI Technical Digest*, p. 93 (1987).
Auer et al., *Extended Abstracts of 22nd Conference on Solid State Devices and Materials*, p. 401 (1990).

Primary Examiner—William A. Powell
Attorney, Agent, or Firm—Willian Brinks Olds Hofer Gilson & Lione

[57] ABSTRACT

A method of forming a contact structure comprising a first step whereby a contact hole is formed with an etching stopper film by way of self-alignment, a second step whereby the etching stopper film is removed from the contact hole, and a third step of metallization, whereby unnecessary intermediate film layers are removed from the connected regions.

12 Claims, 14 Drawing Sheets

IIIb    IIIb 5,174,858

METHOD OF FORMING CONTACT STRUCTURE

BACKGROUND OF THE INVENTION

1. Field of the Invention

The present invention relates to a method of forming a contact structure in a semiconductor device, and more particularly, to a method of forming a contact structure on a semiconductor substrate containing fine recesses and projections.

2. Description of the Prior Art

First, an example of a conventional contact structure provided in a semiconductor device is described below, specifically the process for connecting metallic wires to diffusion regions formed on the surface of a semiconductor substrate.

FIG. 1(a) is a plan view of an SCC type dynamic RAM a sectional view of the SCC type dynamic RAM cell taken along line Vb—Vb in FIG. 1(a). The cell contains a Contact structure between the drain diffusion region of a transfer transistor and a bit line. The reference numeral 1 shown in FIG. 1(b) designates a silicon substrate, the reference numeral 2 designates an active region, the reference numeral 3 designates a transfer transistor, the reference numeral 4 designates a drain diffusion region, the reference numeral 5 designates a separation trench, the reference numeral 6 designates a capacitance trench, the reference numeral 7 designates a polycrystalline silicon film available for a word line, and the reference numeral 8 designates a silicon oxide (SiO2) film for composing a word line. The reference numeral 9 designates a word line which is composed of the polycrystalline silicon film 7 and the silicon oxide film 8. Further, the reference numeral 10 designates a side-wall insulation film, the reference numeral 11 designates a ground silicon oxide film, the reference numeral 13 designates a BPSG film, the reference numeral 14 designates a contact hole, the reference numeral 16 designates another polycrystalline silicon film for composing a bit line 18, and the reference numeral 17 designates a tungsten silicide (WSi$_x$ film. The bit line 18 is composed of the polycrystalline silicon film 16 and the tungsten silicide film 17. In the event a reference numeral is not shown in subsequent drawings, reference should be made to FIG. 1(b) for clarification.

Referring now to FIG. 2(a)-2(c), a first example of a conventional method of forming a contact hole is described below. As shown in FIG. 2(a), first, a synthetic film composed of the silicon oxide film 11 and the BPSG film 13 is deposited on the silicon substrate 1 which has fine recesses and projections on the surface and the diffusion drain region 4 (not shown) under the surface. In this case, the silicon oxide film 11 is deposited on the silicon substrate 1 in order to suppress the diffusion of boron and phosphor from the BPSG film 13 to the silicon substrate 1.

Next, as shown in FIG. 2(b), by using reactive ion etching process with a mask of contact-hole resist pattern 21 the contact hole 14 is provided through the silicon oxide film 11 and the BPSG film 13, so that the surface of the silicon substrate 1 can be exposed at the bottom of the contact hole 14. The diffusion drain region 4 (not shown) is to be formed on the surface of the silicon substrate 1 later on.

Next, as shown in FIG. 2(c), the contact-hole resist pattern 21 (not shown) is removed, and then, residue is removed from the surface of the silicon substrate 1 exposed on the bottom of the contact hole 14 by executing an etching process in solution containing buffered fluoric acid for example. Then, by applying a CVD (chemical vapor deposition) process, for example, the polycrystalline silicon film 16 for the bit line 18 is deposited on the surface of the contact hole 14. While executing the CVD process, conventionally, the temperature in a reactor tube is cooled to be 300° C. or less in order to prevent the surface of the silicon substrate 1 from oxidizing itself again, when the silicon substrate 1 is inserted. Alternatively, a CVD apparatus under reduced pressure is made available so that oxygen can be prevented from leaking into the CVD apparatus when the silicon substrate 1 is inserted. Next, an oxidized film is removed from the surface of the polycrystalline silicon film 16 with the etching process for example in a solution of buffered fluoric acid, and then, the tungsten silicide film 17 is deposited on the polycrystalline silicon film 16 for the bit line.

Next, arsenic is implanted into the synthetic film composed of the polycrystalline silicon film 16 and the tungsten silicide film 17, and then, a patterning process is executed for the pattern of the bit line 18 by applying a resist pattern. Next, thermal treatment at 900° C. for 30 minutes is performed, so that arsenic diffuses itself over the superficial region of the silicon substrate 1, which is in contact with the bit line 18, to form the diffusion drain region 4 (not shown). Thus, the contact structure shown in FIG. 1 is obtained.

FIG. 3 shows a sectional view of a second example of a conventional contact structure between the bit line 18 and the drain diffusion region 4 of a transfer transistor 3 in the SCC type dynamic RAM cell produced by using the first conventional method. In the contact structure shown in the first example, the size of the contact hole of the second example is enlarged to a degree so as to be formed easily by reducing the side-wall insulation film 10 on the side of the contact hole 14.

FIG. 4 shows a sectional view of a third example of a conventional contact structure between the bit line 18 and the drain diffusion region 4 of a transfer transistor 3 built in the SCC type dynamic RAM cell also provided by using the first conventional method. The third example provides a polycrystalline silicon film 12 as the etching stopper on the side of the contact hole 14 of the silicon oxide film 8 for the word line in the second example. For example, this prior art was disclosed by T. Taga et al., Extended Abstracts of 19th SSDM, pages 15-18, 1987.

Next, by referring to FIGS. 5(a)-5(f), a second conventional method of forming a contact structure of the third example is described below. As shown in FIG. 5(a), first, a silicon oxide film 11 is deposited on a silicon substrate 1 which superficially contains fine recesses and projections. Next, as shown in FIG. 5(b), a first contact resist pattern 19 having an aperture corresponding to a contact hole 14 is formed on the silicon oxide film 11. Next, the silicon oxide film 11 exposed to the aperture of the first contact resist pattern 19 is removed by applying a reactive ion etching process.

Next, as shown in FIG. 5(c), after the first contact hole resist pattern 19 (not shown) is removed, the polycrystalline silicon film 12 acting as an etching stopper is deposited on the silicon oxide film 11 and then, ionized arsenic is implanted into the polycrystalline silicon film 12.

Next, a resist pattern 20 of the etching stopper is formed in a region of the polycrystalline silicon film 12 where the contact hole 14 (not shown) is to be formed. Next, as shown in FIG. 5(d), the polycrystalline silicon film 12 acting as the etching stopper is removed, except for that portion of the polycrystalline silicon film 12 corresponding to the position of the resist pattern 20 (not shown), and then the resist pattern 20 is also removed. Next, a BPSG film 13 is deposited on the remaining polycrystalline silicon film 12 and the silicon oxide film 11. Next, a thermal treatment is applied to the deposited BPSG film 13 causing this film to fluidify in order to level off the uneven surface of the silicon substrate 1. At the same time, arsenic diffuses itself in the superficial region of the silicon substrate 1 which contacts the polycrystalline silicon film 12 acting as the etching stopper. As a result, the drain diffusion region 4 is formed on the surface of the silicon substrate 1.

Next, as shown in FIG. 5(e), a second contact-hole resist pattern 22 having an aperture corresponding to the contact hole 14 is formed, and the BPSG film 13 exposed to the aperture region is removed. In this case, the polycrystalline silicon film 12 can effectively function as the etching stopper. More particularly, even when the thickness of the polycrystalline silicon film 12 is decreased to less than one fifth the thickness of the BPSG film 13 and even when the etching time is set enough to remove the BPSG film 13 completely, the silicon oxide film 11 above the word line 9 can fully be prevented from being subjected to the etching process. By using this technique, even after the contact hole 14 is expanded to such a dimension that allows the processing to be done easily, no short-circuit can be generated between the bit line 18 (not shown) and the word lines 9.

Next, as shown in FIG. 5(f), first, the second contact-hole resist pattern 22 (not shown) is removed, and then, the residue is removed from the surface of the polycrystalline silicon film 12 exposed to the contact hole 14 by executing an etching process, for example with a solution of buffered fluoric acid.

Next, a polycrystalline silicon film 16 available for composing a bit line 18 is deposited on the surface of the BPSG film 13 by applying, for example, a CVD process under reduced pressure. In this case, in order to suppress the reoxidization of the exposed surface of the polycrystalline silicon film 12 functioning as the etching stopper, the internal temperature of the reactor tube is cooled at 300° C. or less, when the silicon substrate 1 is inserted into it. Alternatively, a CVD apparatus under reduced pressure is used in order to prevent oxygen from infiltrating into the reactor tube when the silicon substrate 1 is inserted into it. Next, an oxide film is removed from the surface of the polycrystalline silicon film 16 of the bit line 18 by executing an etching process, for example, with a solution containing buffered fluoric acid.

Next, a tungsten silicide film 17 is deposited on the polycrystalline silicon film 16 for the bit line 18 by means of a sputtering process for example. Next, arsenic is implanted into the synthetic film composed of the polycrystalline silicon film 16 and the tungsten silicide film 17, and then, by using a resist pattern, a patterning process is applied to the pattern of the bit line 18 to complete the formation of the contact structure shown in FIG. 4.

Nevertheless, as still finer dimensions of semiconductor devices have recently been required, there are many cases requiring formation of contacts in recessed regions of a silicon substrate having extremely fine recesses and projections. For example, when manufacturing a DRAM cell of 4-16 Mbits or more (refer for example Fuse et al., the proceeding of the 19th Solid Element and Material Conference, P11 (Tokyo in Aug., 1987)), it is necessary to precisely form a contact between the drain diffusion region of the transfer transistor and the bit lines in a space between word lines which adjoin each other at one $\mu$ or less of interval.

When such a contact is formed by applying the first conventional method described above, it is essential to provide extremely small dimensions of the contact hole 14 in order to prevent the bit line 18 from coming into contact with the word lines 9. Therefore, the formation is difficult. Concretely, by assuming 1.4$\mu$ of the bit-line pitch and 1.6$\mu$ of the word-line pitch in order to manufacture a 16 Mbit DRAM, it is necessary to minimize the dimensions of the contact hole 14 to about 0.4$\mu$ square in order that the silicon oxide film 8 on the word line 9 can be prevented from being subject to etching even when the position of masking deviates.

Although the first conventional method can provide 0.5 or 0.6$\mu$ square for the contact hole 14, it is very difficult to provide 0.4$\mu$ square for the contact hole 14 by operating any conventional light-exposure device which is available for the manufacture of 16 Mbit DRAM.

On the other hand, in the second example shown in FIG. 3, the silicon oxide film 8 for the word line 9 is subjected to etching when the BPSG film 13 and the silicon oxide film 11 exposed to the aperture of the contact-hole resist pattern 21 are removed, to expose partially the polycrystaline silicon film 7 for the word line. Therefore, electrical short-circuit is liable to occur between the bit line 18 and the word line 9.

Additionally, the silicon oxide film 8 is not etched in the second conventional method. Thus, the second conventional method needs to repeat the etching processes twice, and further it includes two processes to deposit polycrystalline silicon film which require care for suppressing the re-oxidization of the surfaces of the exposed silicon substrate or polycrystalline silicon film. In other words, the conventional second method involves extremely complex processes.

Furthermore, according to the second conventional method, since the polycrystalline silicon film 12 acting as the etching stopper is present between the drain diffusion region 4 and the bit line 8, it is quite difficult to secure a stable electrical connection.

Küsters et al. disclosed a method of forming a contact in RAM with use of a wet etching process (Symp. VLSI Tech. Dig. (1987) p93) wherein a nitride layer serves as an etch stop. Auer et al. discloses a method of forming a DRAM wherein a polysilicon is used as an etch stop and the polysilicon is oxidized completely (Extended Abstracts of 22nd Conf on Solid State Devices and Materials, 1990, P401). However, short-circuit is liable to happen in these methods.

SUMMARY OF THE INVENTION

It is an object of the invention to provide a novel method of forming a contact structure in a small space, where the dimension of the contact hole can easily be expanded without causing internal wires to come into contact with each other.

A first method of forming a contact structure according to the present invention comprises the steps of (a) depositing successively, a first insulation film, a first conductive film, and a second insulation film on a surface of a substrate having fine recesses and projections on the surface; (b) forming a first resist pattern on the second insulation film, the resist pattern having an aperture, (c) removing a part of the second insulation film exposed to the aperture by applying a reactive ion etching process with use of the resist pattern so as to form a first contact hole through the second insulation film, whereby the first conductive film serves as an etch stopper; (d) removing a part of the first conductive film exposed to the aperture so as form a second contact hole through the first conductive film; (e) removing a part of the first insulation film exposed to the aperture contact hole through the first insulation film and (f) depositing a second conductive film in the contact hole which consists of the first contact hole and the second contact hole.

In a second method according to the present invention, a spacer film is deposited on the second contact hole, and a third contact hoe is formed through the spacer film and the first insulation film.

In the step for removing the second insulation film by applying a reactive ion etching, the first conductive film is used as the etching stopper, so that the dimensions of the contact hole can securely be expanded without causing the internal wires to come into contact with each other. Furthermore, after removing the second insulation film by applying the reactive ion etching the first conductive film and the first insulation film exposed to the aperture of the resist pattern are removed to form the contact hole, and then the second conductive film is deposited on the internal surface of the contact hole. Therefore, no new layer is interposed between the second conductive film and the substrate.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, in which.

DESCRIPTION OF THE PREFERRED EMBODIMENTS

Referring now to the accompanying drawings, a method of forming the contact structure according to the first embodiment of the invention is described below.

First Embodiment

Figure 6A:
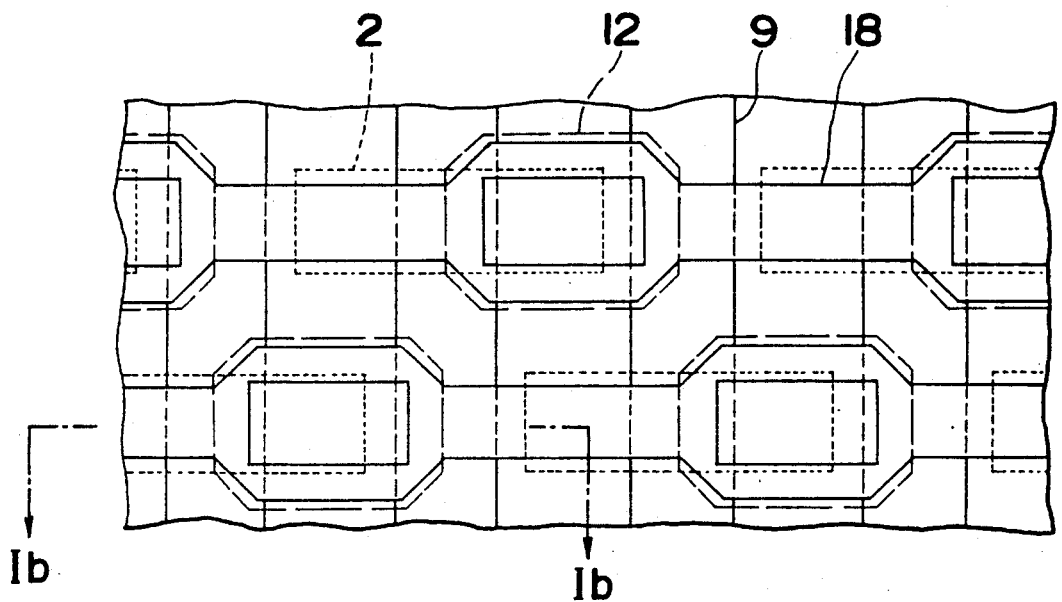
FIG. 6(a) is a plan view of a semiconductor device incorporating the contact structure according to a first embodiment of the invention.
Figure 6B:
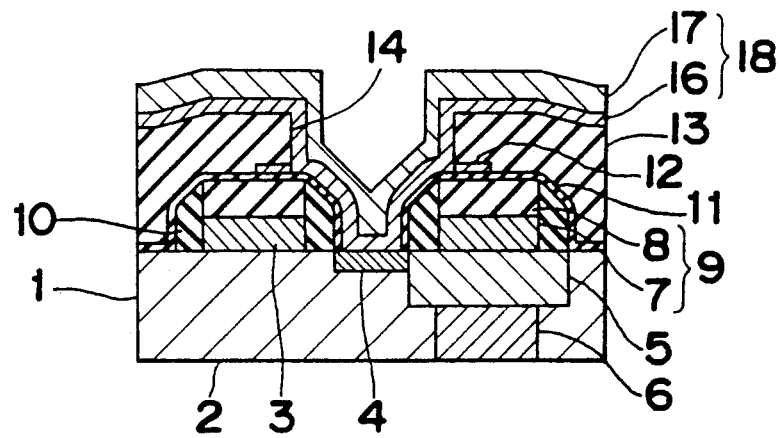
FIG. 6(b) is a sectional view of the semiconductor device shown in FIG. 6(a) taken along line Ib—Ib.

FIGS. 6(a) and 6(b) show a first example of a semiconductor device including a contact structure formed according to the first embodiment. FIG. 6(a) is a plan view of the semiconductor device, whereas FIG. 6(b) is a sectional view of the semiconductor device taken along line Ib—Ib of FIG. 6(a). FIGS. 7(a)-7(f) display sectional views of a semiconductor device under the process for forming the contact structure according to the first embodiment of the invention. FIGS. 8(a) and 8(b) are plan views designating the difference in the shape of bit lines according to the difference of etching applied to the contact hole. It is to be noted that the first example represents the contact structure between the drain diffusion region and the bit lines of a transfer transistor of the SCC type DRAM of the above-mentioned prior art of Fuse et al.

Referring now to FIGS. 6(a) and 6(b), the reference numeral 1 designates a silicon substrate, the reference numeral 2 designates an active region, the reference numeral 5 designates a transfer transistor, and the reference numeral 4 designates a drain diffusion region. A trench 5 for separation and a trench 6 for capacitance respectively form a necessary part on the surface of the silicon substrate 1. In this case, any region other than the trenches 5 and 6 makes up the active region 2, in which the transfer transistor 5 is formed.

Further, the reference numeral 7 designates a polycrystalline silicon film and the reference numeral 8 designates a silicon oxide ($SiO_2$) film, composing word lines 9. The word lines 9 are produced by processing the synthetic film composed of the polycrystalline silicon film 7 and the silicon oxide film 8 into a predetermined shape.

Still further, the reference numeral 10 designates a side-wall insulation film, the reference numeral 11 designates a silicon oxide film, the reference numeral 13 designates a BPSG film, the reference numeral 14 designates a contact hole, the reference numeral 16 designates a polycrystalline silicon film available for composing a bit line, and the reference numeral 17 designates a tungsten silicide ($WSi_x$) film. The polycrystalline silicon film 16 and the tungsten silicide film 17 compose a bit line 18. The side-wall insulation film 10 is formed in order to provide a "lightly doped drain" (LDD) structure for the transfer transistor 3. The detailed structure of the transfer transistor 3 and the trench 5 for capacitance and also the structure for the connection between the transfer transistor 3 and the trench 5 are omitted in FIG. 6(a) for simplicity of display.

In order to produce a 16 Mbit DRAM, the active region 2 will need to secure about $0.6 \times 2.6$ μs of area space, whereas the word lines 9 will need to secure about 0.6μ of width and about 0.8μ of intervals.

The contact structure of the first embodiment is formed in order to connect the drain diffusion region 4 of the transfer transistor 3 to the bit line 18. The region in which the drain diffusion region 4 actually contacts with the bit line 18 has 0.5μ of length in the direction in parallel with the word lines 9 and about 0.4μ of width in the perpendicular direction. On the other hand, the contact hole 14 has sizes of about 0.5 and 1.0 μm in the direction in parallel and perpendicular to the word line 9, respectively. Thus, the contact hole 14 extends from a recess between word lines 9 to a projection on the word lines 9, and a contact region is actually formed on those word lines 9. It is to be noted that the depth of the contact region in the direction perpendicular to the word lines 9 is less than the interval between the word lines 9 because the side-wall insulation film 10 is formed on the lateral side of those word lines 9.

Next, by referring to FIGS. 7(a)–7(f), the method of forming the contact structure shown in the first example according to the first embodiment of the invention is described below.

Figure 7:
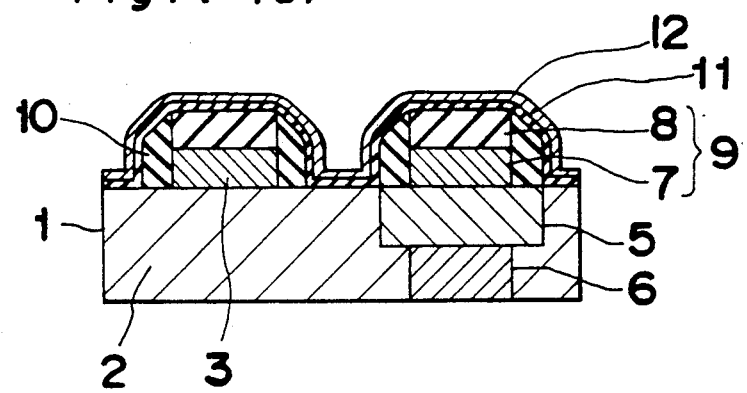
FIGS. 7(a) to 7(f) are sectional views of a semiconductor device produced according to the first embodiment of the invention.
Figure 7:
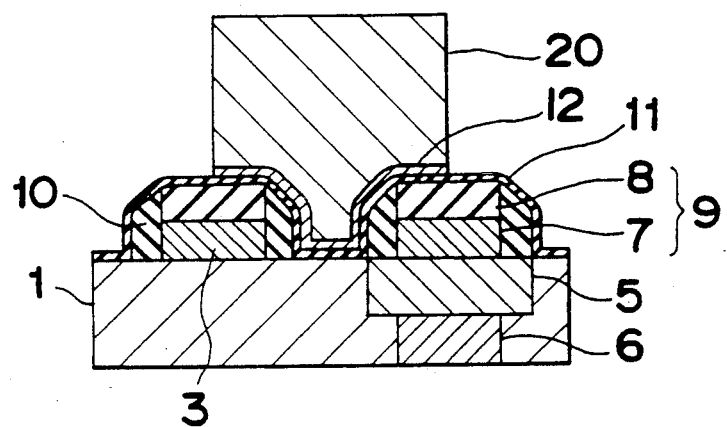
Figure 7:
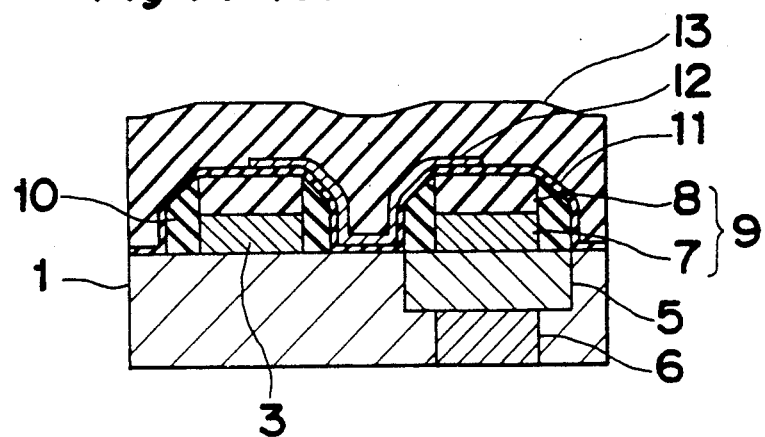
Figure 8A:
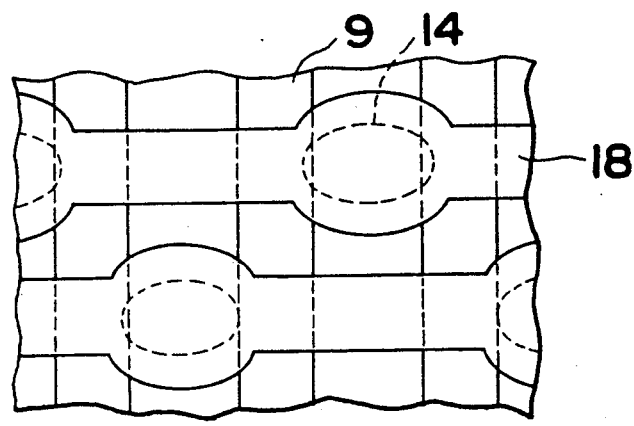
FIG. 8(a) is a plan view of a semiconductor device in which a contact hole is formed by applying an anisotropic etching process.
Figure 8B:
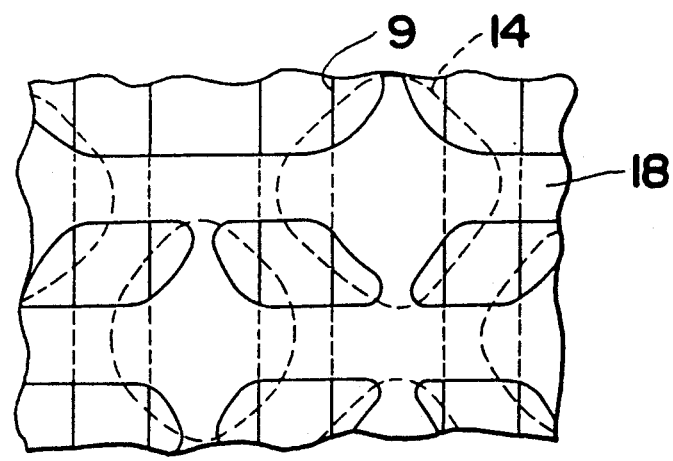
FIG. 8(b) is a plan view of a semiconductor device in which a contact hole is formed by applying anisotropic etching process.

First, as shown in FIG. 7(a), a silicon substrate 1 has an active region 2, a trench for separation 5 and a trench for capacitance 6 below the surface, and word lines 9 and a side-wall insulation film 10 on the surface. Therefore, the substrate 1 has fine recesses and projections. Next, a silicon oxide ($SiO_2$) film 11 as a first insulation film having 20–100 nm of thickness is deposited on the silicon substrate 1, and then, a polycrystalline silicon film 12 as an etching stopper as well as a first conductive film having 20–100 nm of thickness is deposited on the silicon oxide film 11.

Next, as shown in FIG. 7(b), an etching stopper resist pattern 20 is formed in a region (for forming a contact hole 14) on the polycrystalline silicon film 12, and then the polycrystalline silicon film 12, except for the regions corresponding to the resist pattern 20, is removed. In this case, it is necessary for manufacturers to form the contact hole 14 only in the region in which the polycrystalline silicon 12 remains. Therefore, it is preferable that a photomask for forming the etching stopper resist pattern 20 is produced by the inversion Of the photomask needed for the formation of contact-hole resist pattern 21 (which will be described later) and the expansion of the photomask in the shading region on one-side by 0.2 to 0.5μ. However, in the method according to the first embodiment a photomask is formed by cutting off further 0.2μ at corner portions after the above-mentioned steps. Such a photomask makes the formation easier. The removal of the polycrystalline silicon film 12 from the regions other than the etching stopper resist pattern 20 is executed with a plasma etching process in gaseous environment containing $CF_4$ gas and $O_2$ gas. Execution of the plasma etching process for the formation of the etching-stopper polycrystalline silicon film 12 effectively removes all the residual polycrystalline silicon film 12. Therefore, an electrical short-circuit will not occur between the bit lines otherwise caused by presence of residue of the polycrystalline silicon film 12, when compared with a conventional insulation method, for example, by providing a silicon oxide film after oxidation of the polycrystalline silicon film 12.

As shown in FIG. 7(c), after eliminating the etching stopper resist pattern 20 (not shown), the second insulation BPSG film 13 having 200–800 nm of thickness is deposited on the silicon oxide film 11 and the etching-stopper polycrystalline silicon film 12. Next, thermal treatment is executed at 900° C. for 30 minutes to fluidize the BPSG film 1 so that unevenness on the surface of the silicon substrate 1 can be levelled off. After completing the thermal treatment, the BPSG film 13 is thinner on the projections of the word lines 9, whereas it is thicker on the recesses between the word lines 9.

Figure 7D:
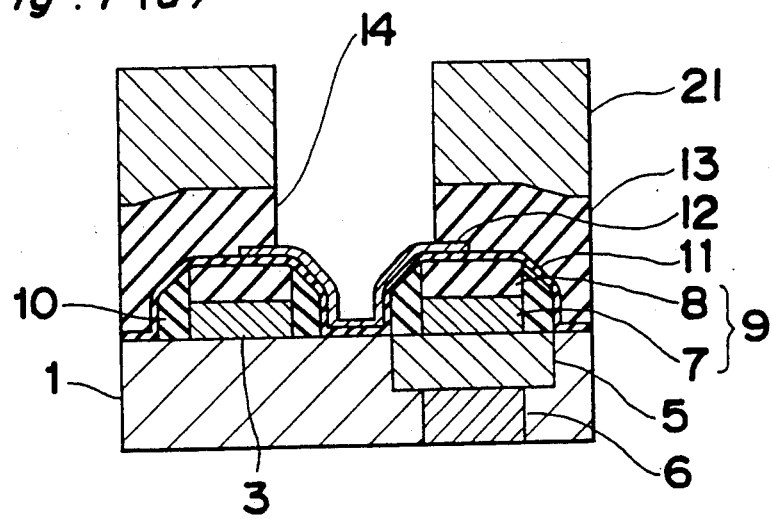

Next, as shown in FIG. 7(d), a contact-hole resist pattern 21 is formed on the BPSG film 13, where the contact-hole resist pattern 21 has an aperture corresponding to the contact hole 14. In this case, since the contact hole 14 has about $0.5 \times 1.0$μ of dimension, the contact-hole resist pattern 21 is formed on both of the projections and recesses of the silicon substrate 1. By taking into account the resolution of the light-exposure apparatus which will be available for the manufacture of a 16 Mbit DRAM, the size of the contact hole 14 can easily be realized. Next, the BPSG film 13 exposed to the aperture is removed. If a reactive ion etching process is used in the removal process in gaseous atmosphere containing $CHF_3$ gas and $O_2$ of a ratio 8:1 to 20:1, the BPSG film 13 can be etched at a rate 5 to 20 times faster than that of the polycrystalline silicon film 12. Therefore, the polycrystalline silicon film 12 can effectively function as an etching stopper. Furthermore, even when the thickness of etching-stopper polycrystalline silicon film 12 is reduced to less than about a fifth of the thickness of the BPSG film 15, and the etching period is set enough to fully remove the BPSG film 13 between the word lines 9, it is possible that the silicon oxide film 11 on the word lines 9 is not etched absolutely. Then, no electrical short-circuit occurs between the word lines 9 and the bit lines 10 even though the contact-hole resist pattern 21 expands up to above the word lines 9.

Figure 7E:
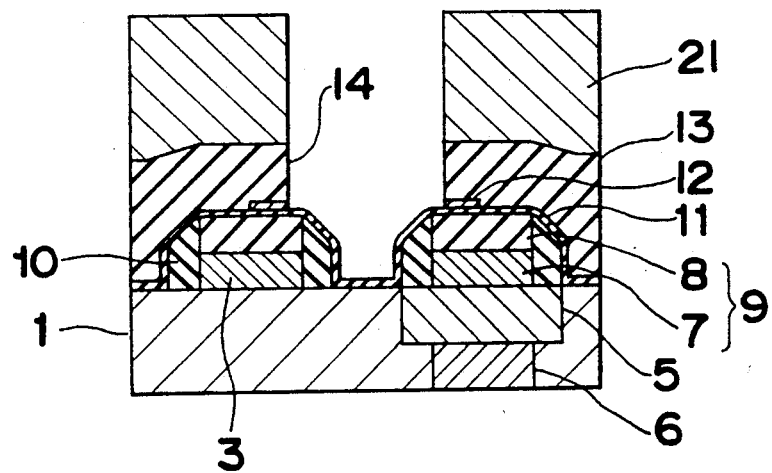

Furthermore, by using the polycrystalline silicon film 12 as the etching stopper, the BPSG film 13 can be etched by applying an anisotropic reactive ion etching process to allow the formation of a contact hole 14 having a dimension identical to that of the resist pattern 21. Therefore, as shown in FIG. 8(a), the contact hole 14 does not extend out of the bit-line pattern 18. Then, no electrical short-circuit takes place between the bit lines 18. By contrast, as shown in FIG. 8(b) a conventional process in which a contact hole 14 is formed by etching the BPSG film 13 with an isotropic wet etching process using, for example, an etching-stopper $Si_3N_4$ film residual resist may result in differential stepwise locations of the contact hole 14 generated outside the bit-line pattern 18, and this may cause a short-circuit Next, as shown in FIG. 7(e), the etching-stopper polycrystalline silicon film 12 exposed to the interior of the contact hole 14 is removed. In order to execute the removal process, a plasma etching process can also be used under the conditions identical to those applied to the patterning of the etching-stopper polycrystalline silicon film 12 with use of, for example, the etching-stopper resist pattern 20.

Figure 7F:
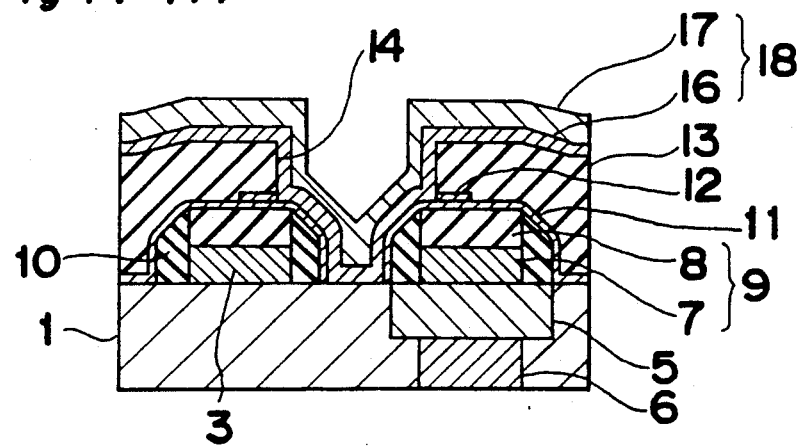

Next, as shown in FIG. 7(f), the silicon oxide film 11 exposed to the interior of the contact hole 14 is removed. In the first embodiment, a portion of the silicon oxide film 11 only in contact with the silicon substrate 1 is removed by applying an anisotropic reactive ion etching process. Next, after the contact-hole resist pattern 21 is removed, residue on the surface of the silicon substrate 1 exposed to the bottom of the contact hole 14 is removed by an etching process with a solution containing, for example, buffered fluoric acid.

Next, a bit-line polycrystalline silicon film 16 as a second conductive film is deposited on the exposed surface of the silicon substrate 1 by applying a CVD process under reduced pressure. In this case, in order to suppress the reoxidation of the exposed surface of the silicon substrate 1, the internal temperature of the reactor tube is cooled to 300° C. or less when the silicon substrate 1 is inserted into it. Alternatively, a CVD apparatus under reduced pressure is used which is capable of preventing oxygen from penetrating into the reactor tube when the silicon substrate 1 is inserted into it. Next, the oxide film is removed from the surface of the bit-line polycrystaline silicon film 16 by executing an etching process in a solution containing for example buffered fluoric acid and then, a tungsten silicide ($WSi_x$) film 17 is deposited by applying for example a sputtering process.

Next, after arsenic is implanted in the synthetic film composed of the bit-line polycrystalline silicon film 16 and the tungsten silicide film 17, a patterning process is applied to the pattern of the bit lines 18 with a resist pattern. Next, thermal treatment is applied to the bit-line pattern 18 at 900° C. for 30 minutes. Thus, arsenic is diffused in the surface region of the silicon substrate 1 in contact with the bit lines 18 to form a drain diffusion region 4 (not shown), thus eventually realizing the contact structure shown in FIGS. 6(a) and 6(b) according to the first example of the invention. There is no new layer in the completed contact structure between the bit lines 18 and the drain diffusion region 4, so the bit lines 18 remain in direct contact with the drain diffusion region 4 and a stable electrical connection is surely achieved.

The description of the first embodiment mentioned above is related to the method of forming a contact structure between the drain diffusion region and the bit lines of a transfer transistor built in a SCC type 16 Mbit DRAM. Needless to say, however, the method of forming the contact structure according to the invention is also effectively applicable to a DRAM cell with more than 16 Mbit of capacity, DRAMs of types other than the SCC type, or any electronic device other than DRAM as well. Further, the method of forming the contact structure according to the invention is also effectively applicable even if there is an object to be connected other than the drain diffusion region and the bit lines.

The foregoing description of the first embodiment has referred to a case in which the dimensions of contact region must be reduced below the limit of photolithograhy. Nevertheless, even when the dimensions of the contact region are not so small, for example, when forming the contact structures of different depth on the silicon substrate and the polycrystalline silicon film at the same time, the method of forming a contact structure according to the invention is effectively applicable.

Still further, the first embodiment uses the silicon oxide film 11 as the first insulation film, the polycrystalline silicon film 12 as the first conductive film, the BPSG film 13 as the second insulation film, and the second conductive film composed of the polycrystalline silicon film and the tungsten silicide film. On the other hand, it is also possible for the first embodiment of the invention to make use of a variety of films other than those which are specified above.

Furthermore, in the first embodiment, after arsenic is implanted into the bit lines, thermally process is performed, so that the drain diffusion region 4 can eventually be formed. On the other hand, it is also possible to form the drain diffusion region 4 prior to the formation of the bit lines.

Second Embodiment

Figure 9A:
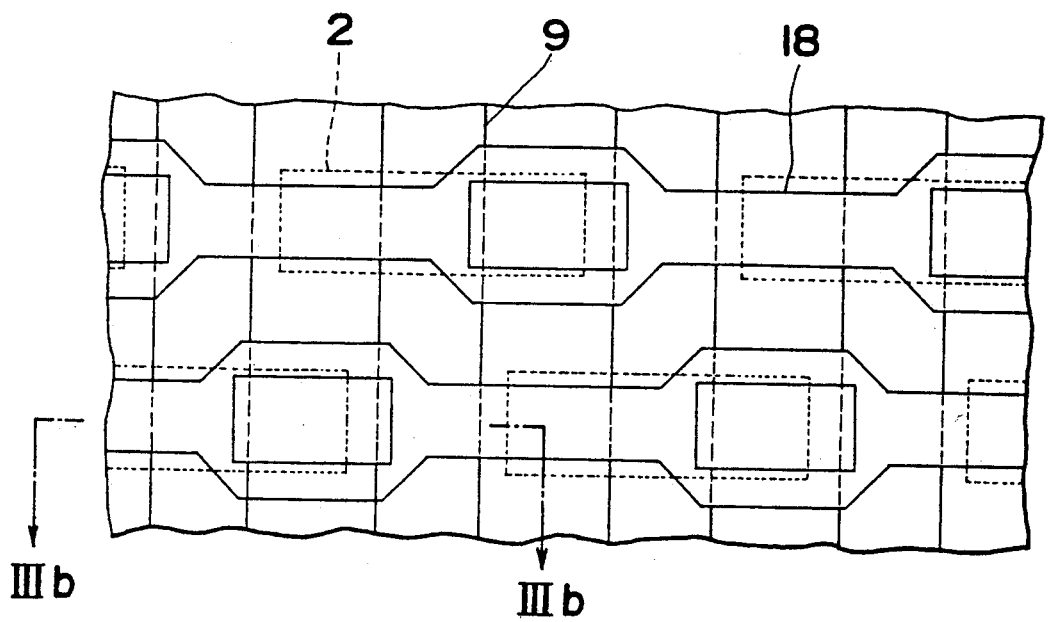
FIG. 9(a) is a plan view of a semiconductor device incorporating the contact structure according to the second embodiment of the invention.
Figure 9B:
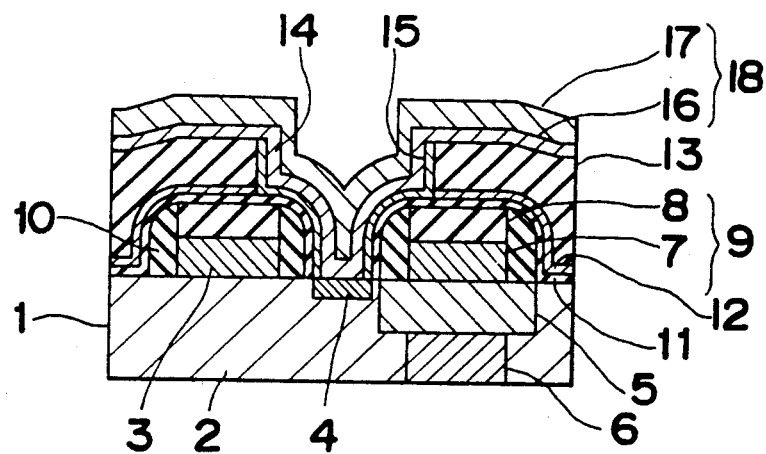
FIG. 9(b) is a sectional view of the semiconductor device shown in FIG. 9(a) taken along line IIIb—IIIb.

FIGS. 9(a) and 9(b) show a second example of a semiconductor device incorporating a contact structure formed in accordance with a second embodiment of the invention. FIG. 9(a) shows a plan view of this semiconductor device, and FIG. 9(b) is a sectional view of the semiconductor device shown in FIG. 9(a) taken along line IIIb—IIIb. The second example also provides a specific contact structure between the drain diffusion region 4 and the bit lines 18 of a transfer transistor built in an SCC type DRAM as the first embodiment On the other hand, unlike the first example, the etching-stopper polycrystalline silicon film 12 in the region outside of the contact hole 14 is not removed, while the bit lines 18 are insulated by means of a spacer silicon oxide film 15.

Next, by referring to FIGS. 10(a)-10(f), the method of forming a contact structure of the second example according to the second embodiment of the invention is described below.

Figure 10A:
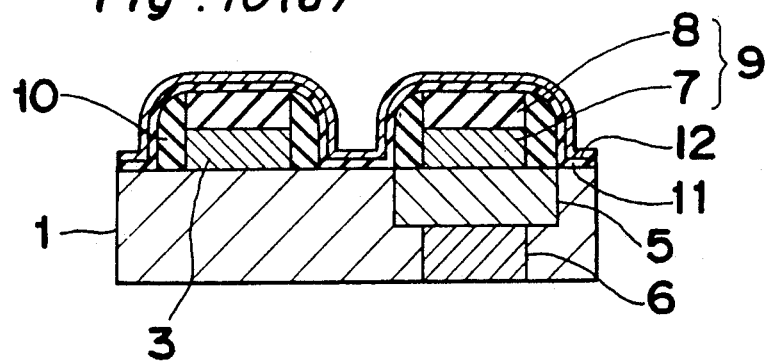
FIGS. 10(a)-10(f) are sectional views of the semiconductor device in the processes according to the second embodiment of the invention.

As shown in FIG. 10(a), first, a silicon oxide film 11 and an etching-stopper polycrystalline silicon film 12 are respectively deposited on the surface of a silicon substrate 1 containing fine recesses and projections by applying steps similar to those used in the first embodiment.

Figure 10B:
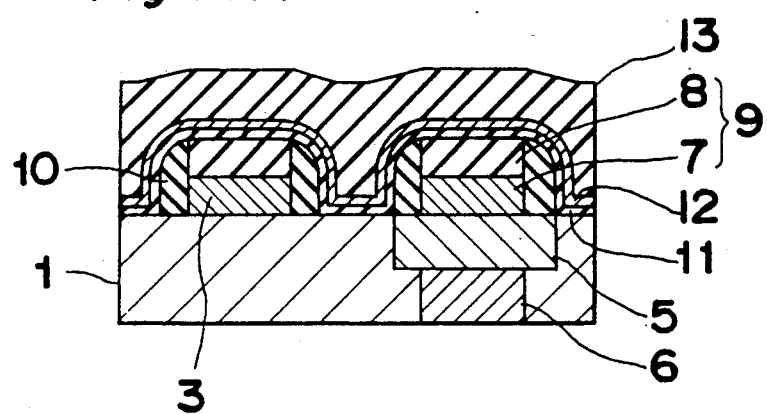

Next, as shown in FIG. 10(b), unlike the first embodiment, a BPSG film 13 as a second insulation film having about 300-800 nm of thickness is deposited on an etching-stopper polycrystalline silicon film 12 without patterning of the polycrystalline silicon film 12. Next, a thermal treatment is applied to the BPSG film 13 to fluidify this film, so as to minimize the unevenness on the surface of the silicon substrate 1.

Figure 10C:
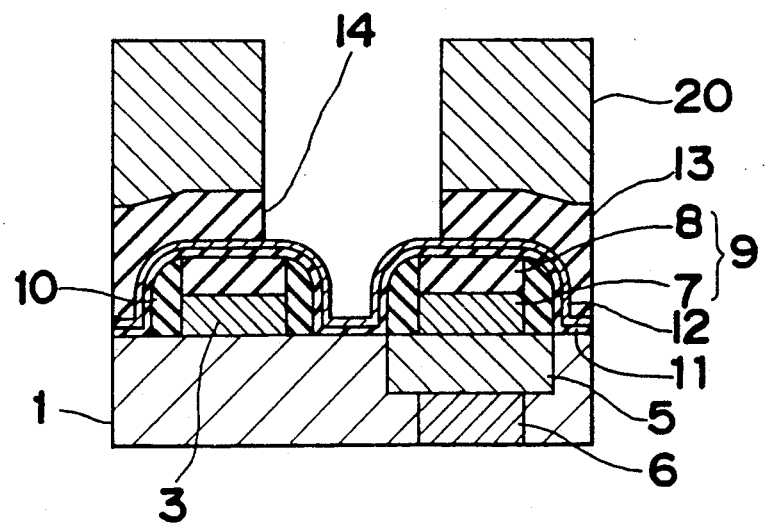

Next, as shown in FIG. 10(c), a contact-hole resist pattern 20 is formed on the BPSG film 13, where the contact-hole resist pattern 20 contains an aperture corresponding to the contact hole 14, and the BPSG film 13 exposed to this aperture is removed by applying a reactive ion etching process. In this case, the contact hole 14 may have dimensions of the same order as those of the first example. Further, similarly to the first embodiment, the polycrystalline silicon film 12 is used as the etching stopper. In addition, by using the reactive ion etching process under the same conditions as those in the first embodiment, it is possible that silicon oxide film 11 on the word lines 9 cannot be etched at all even when the thickness of the etching-stopper polycrystalline silicon film 12 is reduced to less than one-fifth the thickness of the BPSG film 13, and the etching period is set enough to fully remove the BPSG film 13 between the word lines 9. Therefore, even though the contact hole 14 extends to a position above the word lines 9, no short-circuit can take place between the word lines 9 and the bit lines 18.

Figure 10D:
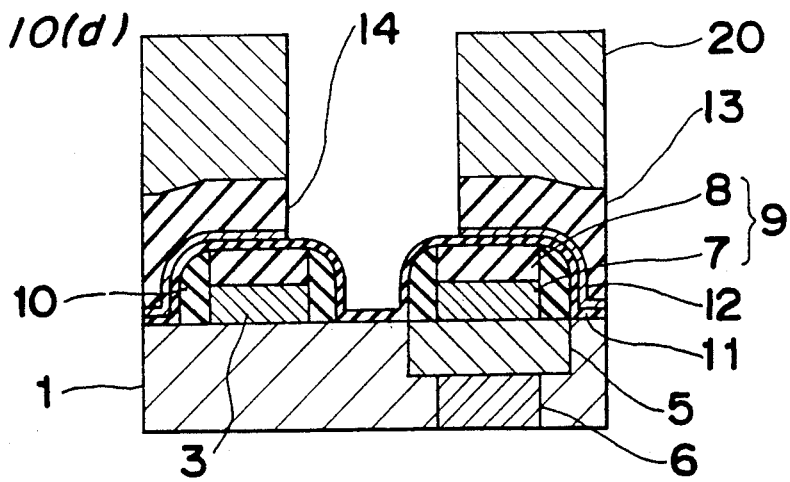

Next, as shown in FIG. 10(d), the etching stopper polycrystalline silicon film 12 exposed to the interior of the contact hole 14 is removed.

Figure 10E:
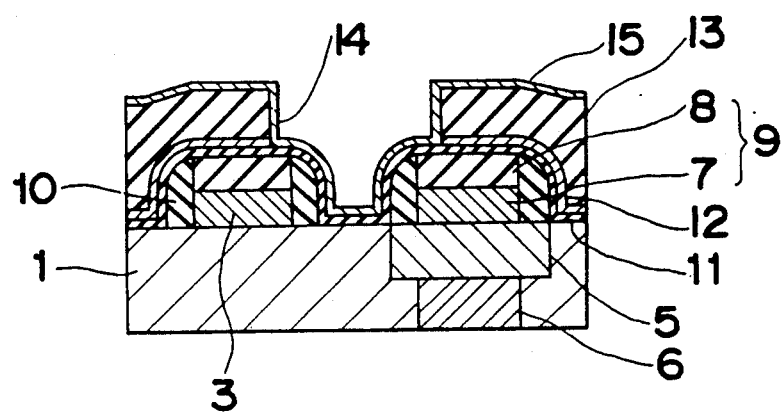

Next, as shown in FIG. 10(e), the contact-hole resist pattern 20 is removed, and then the spacer silicon oxide film 15 is deposited on the entire surface of the silicon substrate 1 until the thickness reaches 20-200 nm.

Figure 10F:
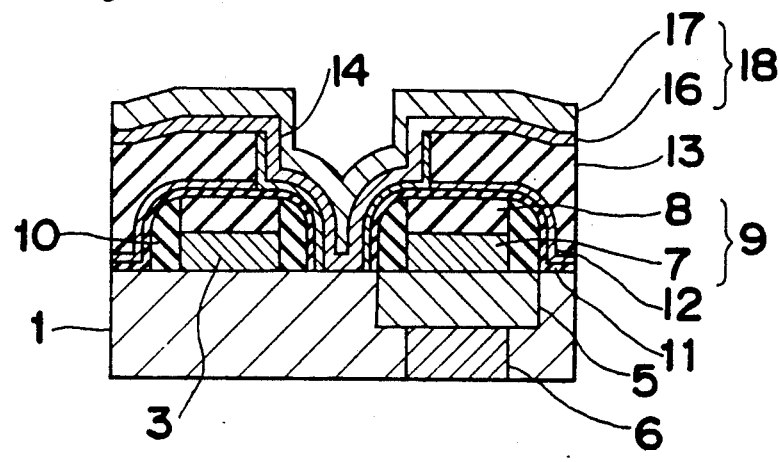

Next, as shown in FIG. 10(f), by using an anisotropic reactive ion etching process, the spacer silicon film 15 (not shown) and the silicon oxide film 11 are removed from the region in contact with the silicon substrate 1. Next, residue is removed from the surface of the silicon substrate 1 exposed to the bottom of the contact hole 14 by etching in a solution containing, for example, buffered fluoric acid. Next, the bit-line polycrystalline silicon film 16 is deposited on the exposed silicon substrate 1 by applying a CVD process under reduced pressure. In this case, in order to prevent the reoxidization of the exposed surface of the silicon substrate 1, the internal pressure of the reactor tube is cooled to about 300° C. or less when the silicon substrate 1 is inserted into it. Alternatively, a CVD apparatus under reduced pressure is used to prevent oxygen from penetrating into the reactor tube when the silicon substrate 1 is inserted into it. Next, the oxide film is removed from the surface of the bit-line polycrystalline silicon film 16 by an etching in a solution containing, for example, buffered fluoric acid. Next, the tungsten silicide film 17 is deposited on the exposed bit-line polycrystalline silicon film 16.

Next, arsenic is implanted into the synthetic film composed of the bit-line polycrystalline silicon film 16 and the tungsten silicide film 17, and then a patterning process is applied to the pattern of the bit line 18 by using a resist pattern. Next, a thermal treatment is executed to diffuse arsenic into the surface region of the silicon substrate 1 in contact with the bit line 18 to eventually form the drain diffusion region 4, thus completing the formation of a contact structure according to the second example. In the contact structure, there is no new layer between the bit line 18 and the drain diffusion region 4 and they are connected directly to each other. Therefore, good electrical connection is easily achieved.

Since the process for patterning the etching-stopper polycrystaline silicon film 12 is not used in the second embodiment, the second embodiment can save the photolithographic process one step when compared with the first embodiment.

Further, the second embodiment relates to a method of forming a contact structure between the drain diffusion region 4 and the bit line 18 of the transfer transistor 3 in the SCC type DRAM 11. On the other hand, when applying the method of the second embodiment to the process for the formation of the contact structure between the drain diffusion region 4 and the bit line 18 of the transfer transistor 3 in a stacked DRAM cell, a polycrystalline silicon film normally used for a plate electrode can effectively be used as a first conductive film. Therefore, the second embodiment can effectively be applied without additionally executing such a process for newly depositing a conductive film. In this case, since the spacer silicon oxide film insulates the plate electrode from the bit line, the second embodiment can omit a process for patterning the polycrystalline silicon film for the plate electrode inside the memory cell array, thus offering a substantial advantage to simplify the production process.

As is clear from the above description, according to the method of forming the contact structure embodied by the invention, the dimensions of a contact hole can securely be expanded without causing contact of the wires with each other since the first conductive film is used as an etching stopper in the process for removing the second insulation film by applying a reactive ion etching process, and the method can securely form a desired contact structure in fine regions.

Furthermore, the method removes the second insulation film, the first conductive film, and the first insulation film which are exposed to the aperture region, to form a contact hole and the second conductive film is deposited on the surface of this contact hole. As a result, no new layer is generated between those regions in contact with each other in the contact hole, thus easily achieving satisfactory electrical connection.

Because of those practical advantages cited above, this method of manufacturing a semiconductor device is very valuable in the industry.

As mentioned above, Küsters et al. discloses a $Si_3N_4$ film as an etch stop for forming a hole with wet etching. When this technique is applied to a TEG of metallic wiring length 1.5 mm and a distance 0.8 μm of bit lines, the percentage of short-circuit between bit lines was 50%, whereas that of the present invention is practically zero. Because the contact size is broadened with the wet etching technique, the distance 0.8 μm is too narrow to prevent the short-circuit. By contrast, this invention uses anisotropic dry etching, so that the contact size is kept the same as the mask size, and the short-circuit does not occur between bit lines.

Figure 11:
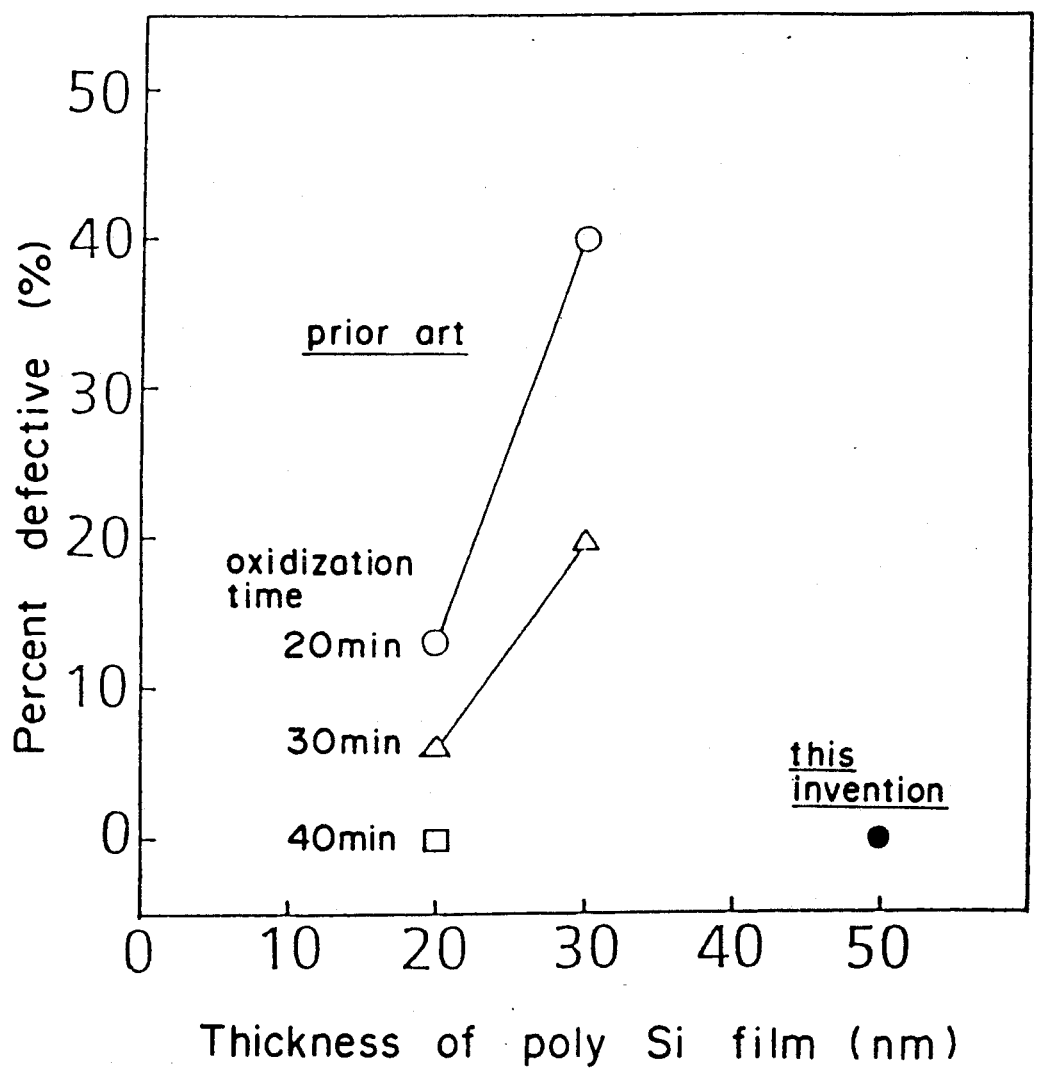
FIG. 11 is a graph of the percent defective of RAM produced by this invention (·) and by a prior art technique of complete oxidation of polysilicon film (○, △, □) plotted against the thickness of polysilicon film.

As mentioned above also, Auer et. al. discloses a technique of the complete oxidation of polysilicon stopper. FIG. 11 shows the percentage of short-circuit between bit lines of a TEG of metallic wiring of 1.5 mm and distance 0.8 μm of bit lines. In the technique of the complete oxidation of polysilicon etch stop, the thickness of the polysilicon etch stop layer has to be less than 20 nm in order to avoid short-circuit. By contrast, practically no short-circuit occurs even for the thickness of 50 nm for the processing of this invention.

Figure 12A:
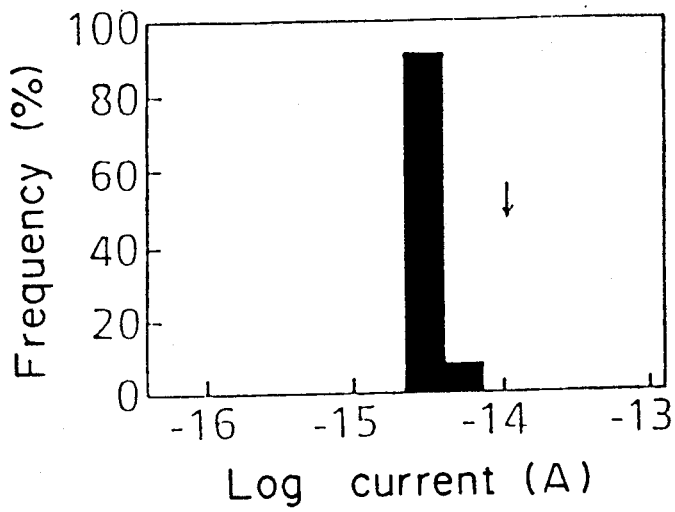
FIGS. 12(a) and (b) are graphs of the frequency of the pn junction leakage of RAM cell array plotted against current of this invention and of a prior art, respectively.
Figure 12B:
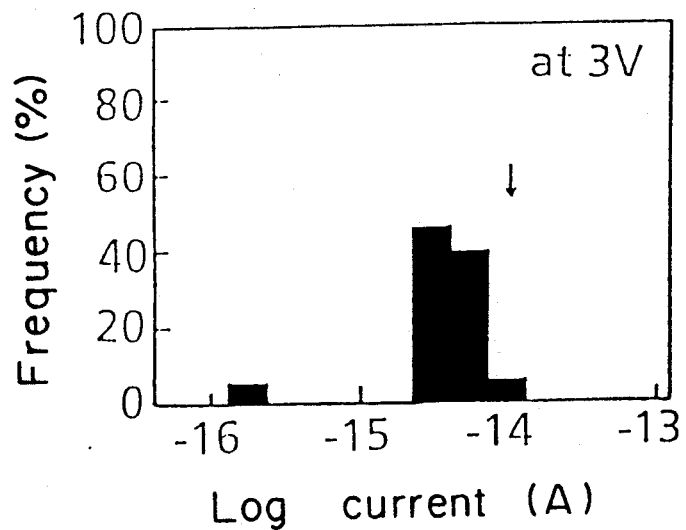

FIGS. 12(a) and 12(b) show the frequency of pn junction leakage of a contact of RAMs produced with the present invention and with the prior art technique, each for cell array of 3700. The pn junction leakage is measured between the conductive layer in the contact and the substrate. In the prior art cell, the thickness of polysilicon etch stop is taken as 20 nm owing to the reason mentioned above. Therefore, the thickness is not sufficient for the etch stop. Then, the substrate is liable to be etched, so that the pn junction leakage characteristic scatters as shown in FIG. 12(b). By contrast, the RAMs used according to this invention have a polysilicon etch stop thickness of 50 μm, the thickness being enough to securely function as an etch stop. Then, as shown in FIG. 12(a), homogeneous characteristics can be realized.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of forming a contact structure, comprising the steps of:
   (a) depositing successively, a first insulation film, a first conductive film, and a second insulation film on a surface of a substrate having fine recesses and projections on the surface;
   (b) forming a first resist pattern on said second insulation film, said resist pattern having an aperture;
   (c) removing a part of said second insulation film exposed to said aperture by applying a reactive ion etching process with use of the resist pattern so as to form a first contact hole through said second insulation film, whereby said first conductive film serves as an etching stopper;
   (d) removing a part of said first conductive film exposed to said aperture so as to form a second contact hole through said first conductive film;
   (e) removing a part of said first insulation film exposed to said aperture contact hole through said first insulation film; and
   (f) depositing a second conductive film in the contact hole, said contact hole comprising said first contact hole, and said second contact hole.

2. The method according to claim 1, wherein said contact hole is provided to connect a drain region and a bit line of a random access memory, further comprising the step of forming the drain region in said substrate in a portion to contact with said second conductive film after the step of depositing said second conductive film.

3. The method according to claim 1, wherein the depositing step of said first insulation film, said first conductive film and said second insulating film includes the steps of:
   depositing the first insulation film and the first conductive film successively on the surface of said substrate;
   forming a second resist pattern on said first insulation film, said second resist pattern having an inverted pattern of said first resist pattern;
   removing a portion of said first conductive film exposed through the second resist pattern;
   removing said second resist pattern; and
   depositing said second insulation film on said first insulation film and said first conductive film.

4. A method of forming a contact structure, comprising the steps of:
   (a) depositing successively, a first insulation film, a first conductive film, and a second insulation film on a surface of a substrate having fine recesses and projections on the surface;
   (b) forming a first resist pattern on said second insulation film, said first resist pattern having an aperture;
   (c) removing a part of said second insulation film exposed to said aperture by applying a reactive ion etching process with use of said first resist pattern so as to form a first contact hole through said second insulation film, whereby said first conductive film serves as an etching stopper;
   (d) removing a part of said first conductive film exposed to said aperture so as to form a second contact hole through said first conductive film;
   (e) depositing a spacer film on said second contact hole;
   (f) removing a part of said first insulation film and said spacer film exposed to said aperture so as to form a third contact hole through said first insulation film; and
   (g) depositing a second conductive film in the contact hole, said contact hole comprising said first contact hole, said second contact hole, and said third contact hole.

5. The method according to claim 4, wherein said contact hole is provided to connect a drain region and a bit line of a random access memory, further comprising the step of forming the drain region in said substrate in a portion to contact with said second conductive film after the step of depositing said second conductive film.

6. The method according to claim 5, wherein said first conductive film is a plate electrode.

7. The method according to claim 1, whereby the dimension of the contact hole is about $0.5 \times 0.1$ μm.

8. The method according to claim 1, whereby the first conductive film has a thickness of about 50 nm, and the frequency of pn junction leakage throughout said first conductive film is constant.

9. The method according to claim 2, whereby the bit line of random access memory remains in direct contact with the drain region thereby preventing an electrical short circuit.

10. The method according to claim 4 whereby the dimension of the contact hole is about $0.5 \times 0.1$ μm.

11. The method according to claim 4, whereby the first conductive film has a thickness of about 50 nm, and the frequency of pn junction leakage throughout said first conductive film is constant.

12. The method according to claim 5, whereby the bit line of random access memory remains in direct contact with the drain region preventing and electrical short circuit.

* * * * *

UNITED STATES PATENT AND TRADEMARK OFFICE
CERTIFICATE OF CORRECTION

PATENT NO. : 5,174,858
DATED : December 29, 1992
INVENTOR(S) : Hiroshi Yamamoto et al.

Figure 1A:
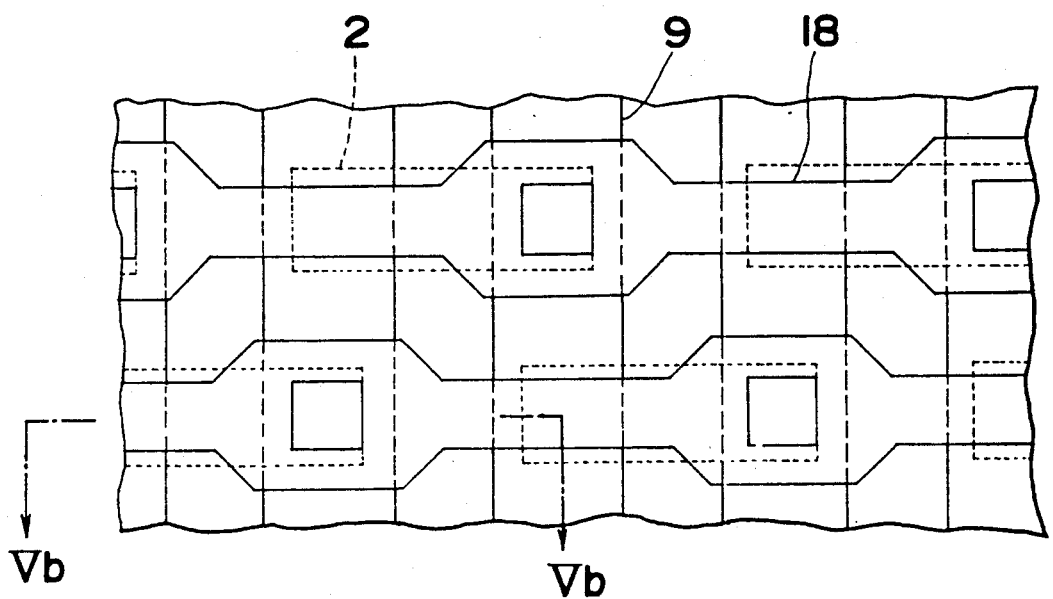
FIG. 1(a) is a plan view of a first example of a semiconductor device incorporating a contact structure according to a first conventional method.
Figure 1B:
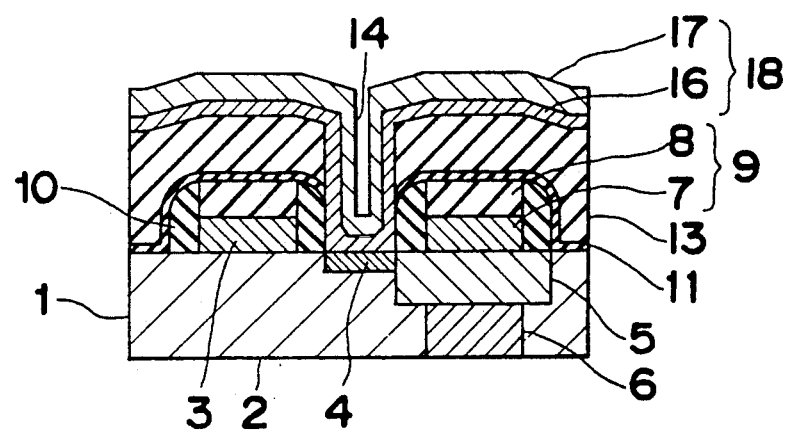
FIG. 1(b) is a sectional view taken along line Vb—Vb in FIG. 1 (a)
Figure 2A:
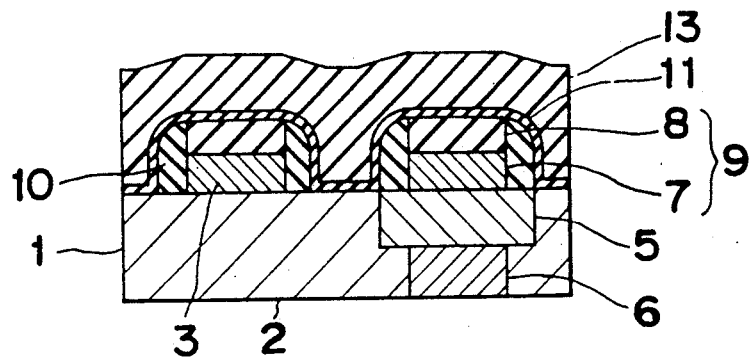
FIGS. 2(a)-2(c) respectively are sectional views of a conventional semiconductor device according to the first conventional method.
Figure 2B:
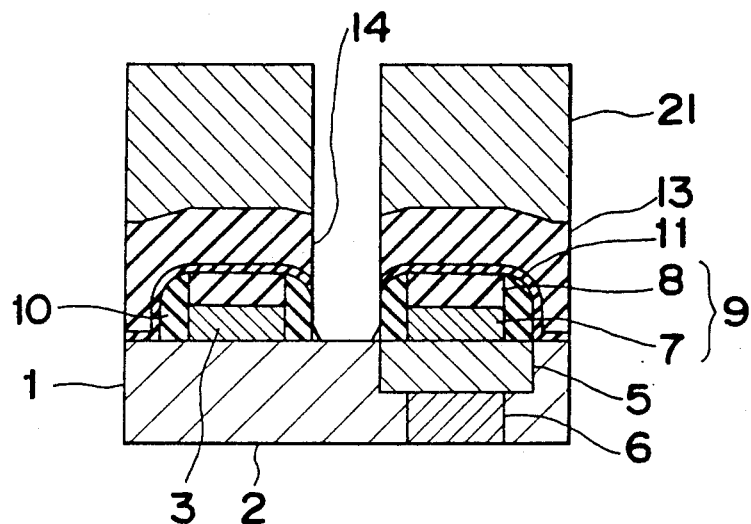
Figure 2C:
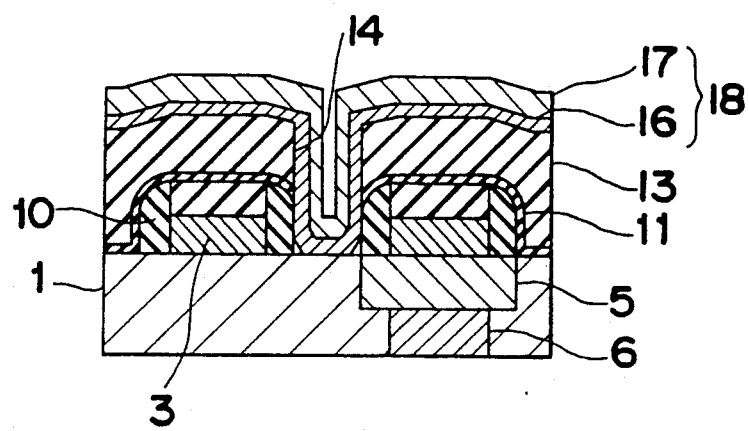
Figure 3:
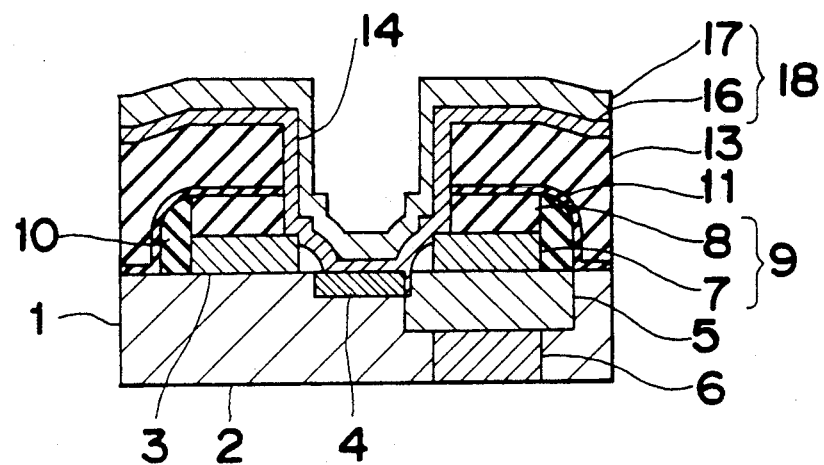
FIG. 3 is a sectional view of a second example of a conventional semiconductor device incorporating the contact structure according to the first conventional method.
Figure 4:
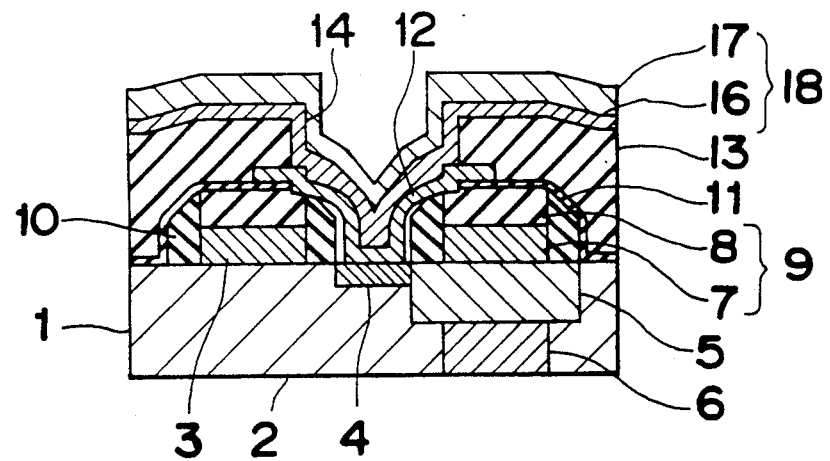
FIG. 4 is a sectional view of a third example of a conventional semiconductor device incorporating a contact structure according to the second conventional method.
Figure 5A:
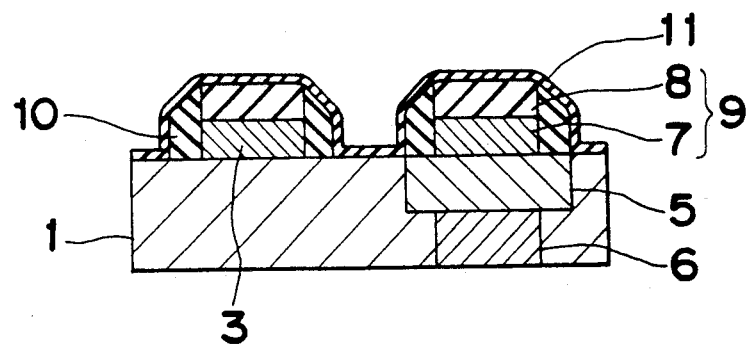
FIGS. 5(a)-5(b) are respectively sectional views of a conventional semiconductor device incorporating a contact structure according to a second conventional method.
Figure 5B:
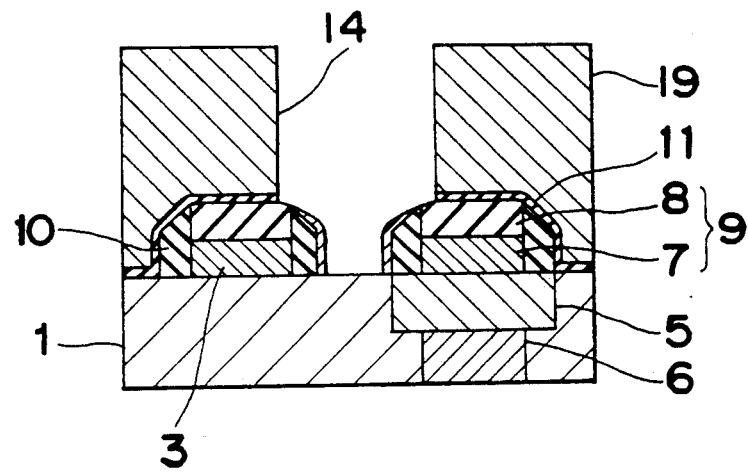
Figure 5C:
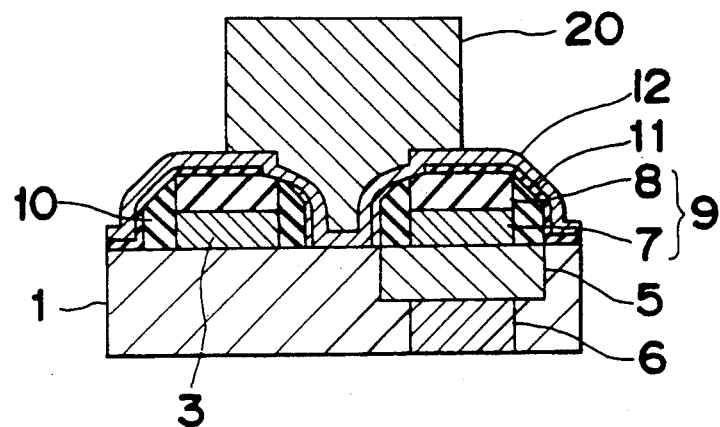
Figure 5D:
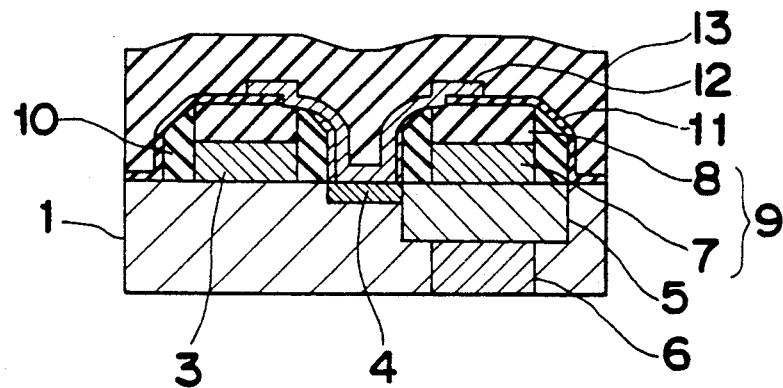
Figure 5E:
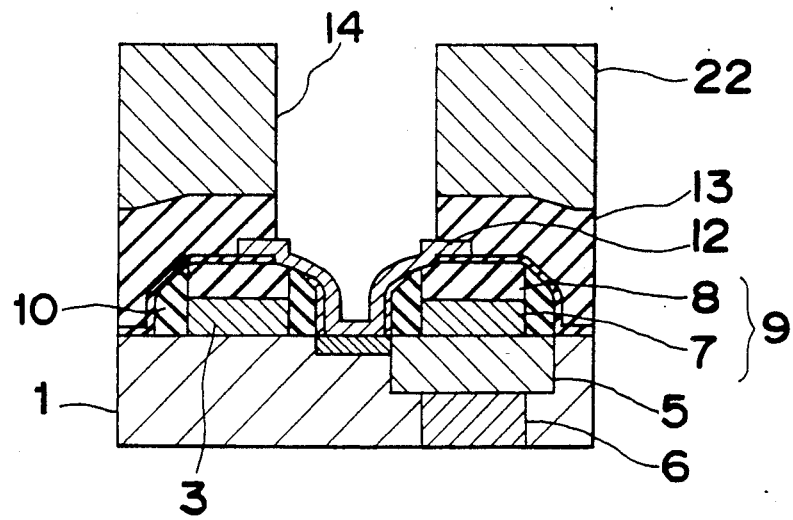
Figure 5F:
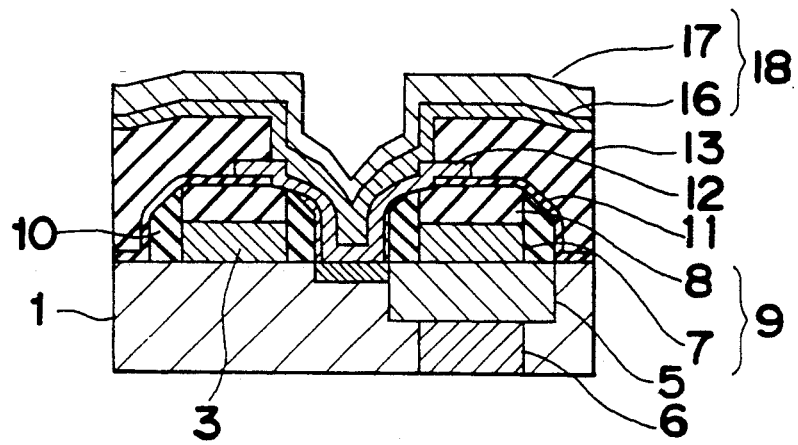

It is certified that error appears in the above-identified patent and that said Letters Patent is hereby corrected as shown below:

Column 1, Line 18, "RAM a sectional" should read --RAM cell produced by a conventional method, while Fig. 1(b) is a sectional--.

Column 1, Line 20, "Contact" should read --contact--.

Column 1, Line 41, "$(WSi_x$" should read --$(WSi_x)$.

Column 2, Line 42, "cell also provided" should read --cell, also produced--.

Column 2, Line 64, "then," should read --then--.

Column 3, Line 10, "13" should read --13,--.

Column 3, Line 13, "1" should read --1,--.

Column 3, Line 58, "process" should read --process,--.

Column 4, Line 2, "example" should read --example to--.

Column 4, Line 32, "polycrystaline" should read --polycrystalline--.

Column 4, Line 55, "Conf" should read --Conf.--.

Column 5, Line 10, "as form" should read --as to form--.

Column 5, Line 13, "film" should read --film;--.

Column 5, Line 19, "hoe" should read --hole--.

UNITED STATES PATENT AND TRADEMARK OFFICE
CERTIFICATE OF CORRECTION

PATENT NO. : 5,174,858

DATED : December 29, 1992

INVENTOR(S) : Hiroshi Yamamoto et al.

It is certified that error appears in the above-identified patent and that said Letters Patent is hereby corrected as shown below:

Column 6, Line 58, "5" should read --3--.

Column 7, Line 22, "in" (second occurrence) should be omitted.

Column 7, Line 26, "in" should be omitted.

Column 7, Line 59, "Of" should read --of--.

Column 8, Line 65, "short-circuit" should read --short-circuit.--.

Column 9, Line 28, "polycrystaline" should read --polycrystalline--.

Column 9, Line 66, "photolithograhy" should read --photolithography--.

Column 10, Line 15, "thermally" should read --a thermal--.

Column 10, Line 31, "embodiment" should read --embodiment.--.

Column 11, Line 52, "polycrystaline" should read --polycrystalline--.

Column 12, Line 31, "short-circuit" should read --short-circuits--.

Column 12, Line 41, "short-circuit" should read --short-circuits--.

Column 12, Line 61, "$\mu$m," should read --nm--.

UNITED STATES PATENT AND TRADEMARK OFFICE
CERTIFICATE OF CORRECTION

PATENT NO. : 5,174,858
DATED : December 29, 1992
INVENTOR(S) : Hiroshi Yamamoto et al.

It is certified that error appears in the above-identified patent and that said Letters Patent is hereby corrected as shown below:

Column 14, Line 1, "fine" should be omitted.

Column 14, Line 51, "and" should read --an--.

Signed and Sealed this

Twenty-second Day of February, 1994

Attest:

BRUCE LEHMAN

Attesting Officer    Commissioner of Patents and Trademarks